Figure 1:
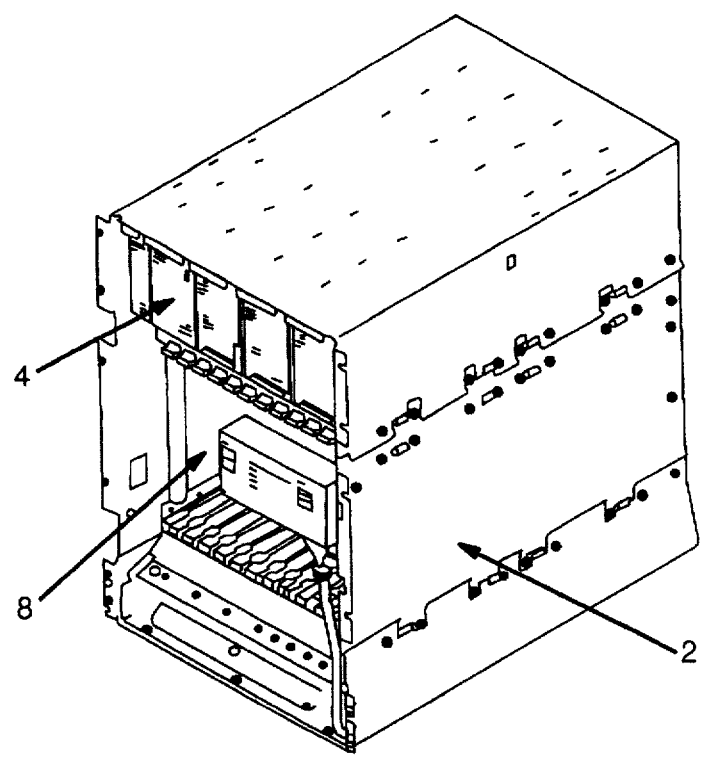
Figure 1:
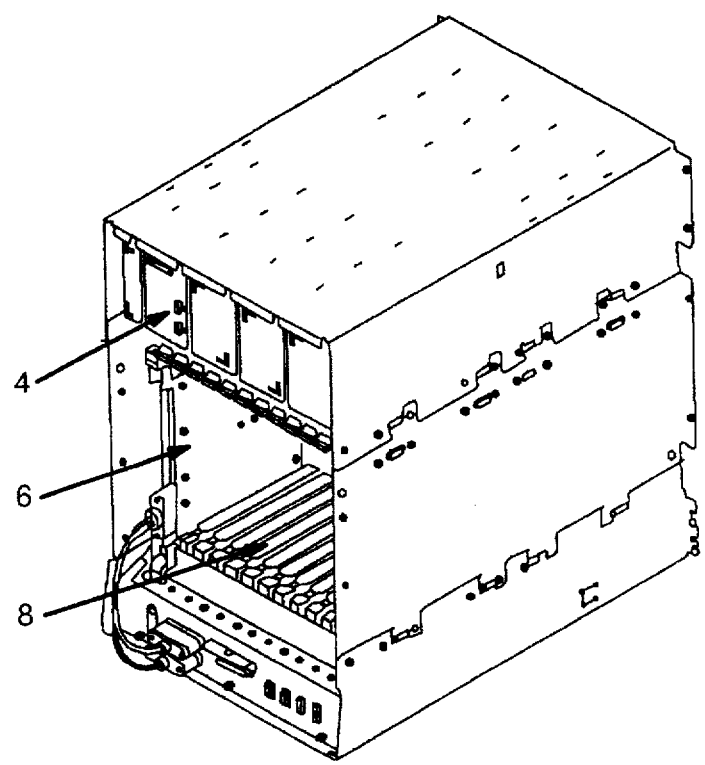

United States Patent [19]

Bernhardt et al.

[11] Patent Number: 5,731,961
[45] Date of Patent: Mar. 24, 1998

[54] RECEIVING DEVICE FOR COMPONENTS DIRECTLY CONNECTED WITH A BOARD

[75] Inventors: Hermann Bernhardt, Schönaich; Johann Haumann, Östelsheim; Gunter Klein, Sindelfingen; Frank Notter, Nufringen, all of Germany

[73] Assignee: International Business Machines Corporation, Armonk, N.Y.

[21] Appl. No.: 716,336

[22] PCT Filed: Mar. 31, 1995

[86] PCT No.: PCT/EP95/01208

§ 371 Date: Sep. 27, 1996

§ 102(e) Date: Sep. 27, 1996

[87] PCT Pub. No.: WO95/27389

PCT Pub. Date: Oct. 12, 1995

[30] Foreign Application Priority Data

Mar. 31, 1994 [DE] Germany .................. 44 11 192.4

[51] Int. Cl.⁶ .................................................. H05K 7/14
[52] U.S. Cl. .......................... 361/796; 361/728; 361/736; 361/755; 439/55; 439/51; 439/59
[58] Field of Search ................... 361/725–727, 361/728, 736, 740, 747, 752, 755, 759, 784, 785, 788, 789, 801, 796, 787; 439/55, 59, 51, 610, 62, 65, 609, 329

[56] References Cited

FOREIGN PATENT DOCUMENTS 0515797  12/1992  European Pat. Off. .
3209205   9/1983  Germany .
3603750   8/1987  Germany .

*Primary Examiner*—Leo P. Picard
*Assistant Examiner*—Anthony Dinkins
*Attorney, Agent, or Firm*—Lawrence R. Fraley

[57] ABSTRACT

The present invention relates to a receiving device for the component parts (4) connected directly with the circuit board (26), in particular electric assemblies. The weight of the electric assembly is carried by a supporting device (30) on contacting the circuit board. The connector (10) which is part of the electric assembly or one of its components is flexibly disposed with respect to the socket (34) of the circuit board, so that the production tolerances can be compensated without problem and a plug-in connection can be achieved between the connector and the socket without the weight of the electric component placing a load on the plug-in connection.

5 Claims, 4 Drawing Sheets

RECEIVING DEVICE FOR COMPONENTS DIRECTLY CONNECTED WITH A BOARD

The present invention relates to a receiving device for component parts which are directly connected with a printed circuit board.

In the development of electronic systems, in particular of data processing systems, a tendency toward a modular design is obvious. Functionally related components are combined in one assembly, if technically realizable. As far as technically feasible, such assemblies are connected with a circuit board by means of a connector. The advantages obtainable due to such a modular approach are to be recognized in the reduction of the plurality of connecting cables between the various components among one another, and in the plurality of connecting cables between the component parts and the circuit board. A reduction of the plurality of connecting cables has the advantage of largely reducing also electromagnetic interactions between such electric connecting leads. Signal errors may thereby largely be excluded. The modular approach has, i.a., the further advantage that complex electronic systems can be produced, tested and maintained in a much simpler way.

One problem encountered in that modular design is, however, that heavy assemblies cannot be connected directly with the circuit board without problems. Because there is a heavy load on the connector between the assembly and the circuit board due to the weight of the assembly, so that the contacts within the circuit board may become destroyed in the course of time. This is in particular true in case that the system is exposed to vibrations or oscillations.

Patent Document P 36 03 750.8 describes an automation device consisting of a central unit and of the input and output assemblies and the assembly carriers which are snapped-on to the mounting rail. The assembly carrier consists of a bottom part and a cover part to which coding disks are rotatably held in the way of a coding clock. In the bottom part a switching circuit board is attached. Socket connectors are attached on the switching circuit board for being connected with the plug connectors of the input or output assemblies respectively and are electrically connected therewith.

It is therefore an object of the present invention to realize a receiving device for assemblies which are directly connected with the circuit board, which permits to connect the assemblies with the circuit board regardless of their weight, without damages occurring in the contacts with the circuit board, such device being simple and inexpensive in production and assembly and not limiting the modular approach.

Said problem is resolved by the characteristics as mentioned in the main claims.

Further advantageous embodiments of the device according to the invention are resolved in the subclaims.

Advantages obtained due to the invention are to be seen essentially in that it is possible to directly connect nearly any assembly of the system regardless of its weight directly with the circuit board. This does away with superfluous electric connecting leads between the individual component parts and the circuit board. Signal transfer errors—caused by neighboring connecting leads—are largely reduced.

Figure 2:
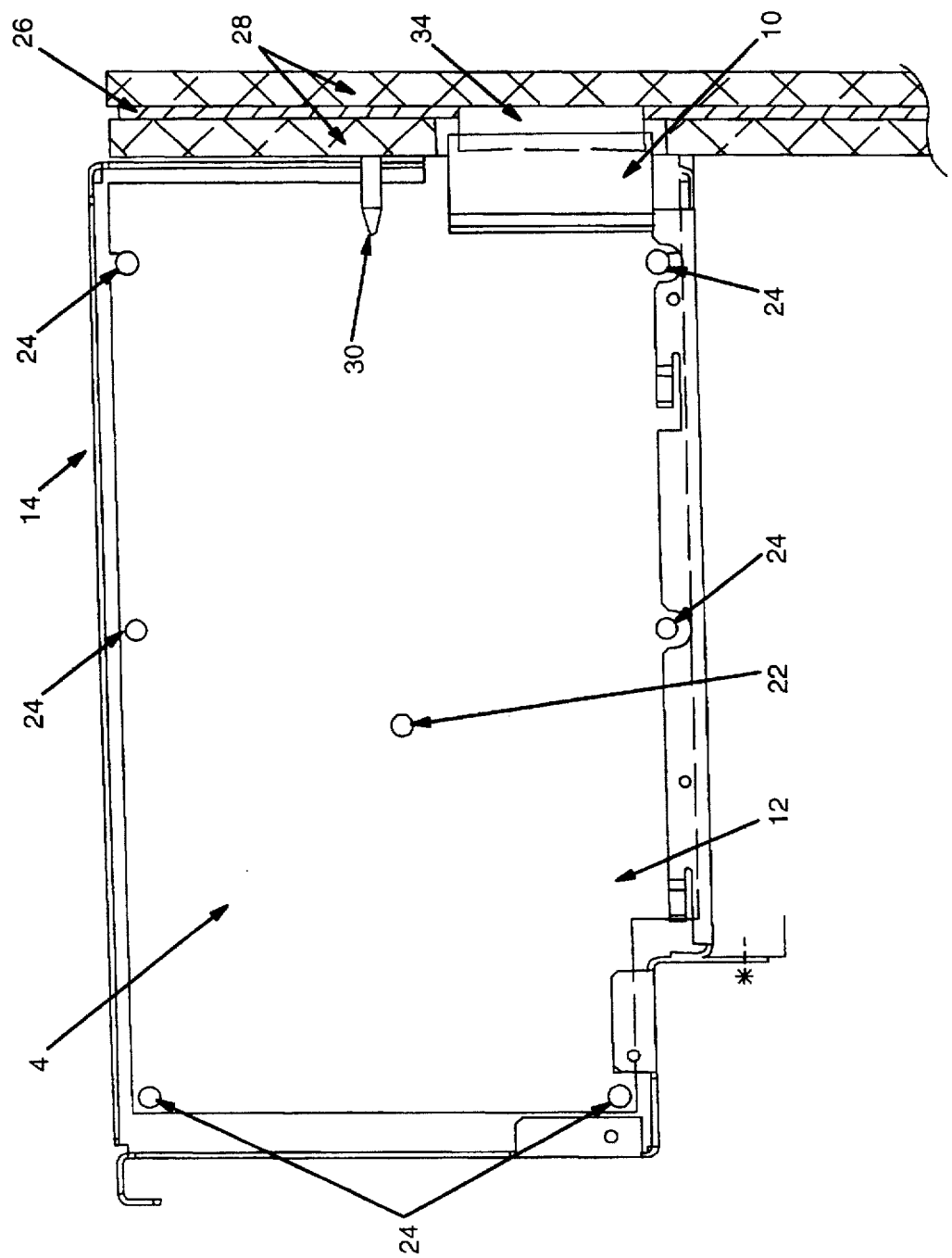
Figure 3:
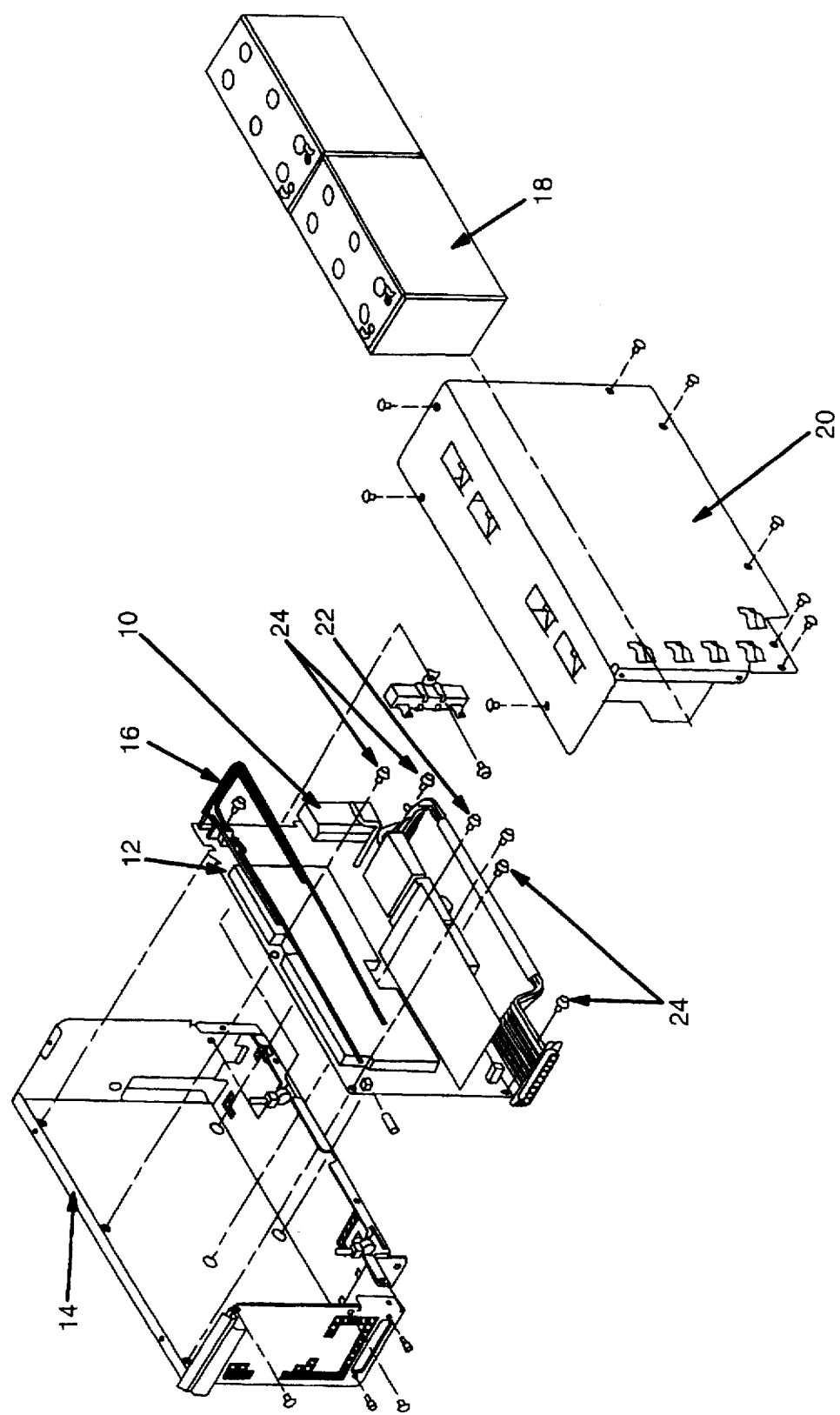
Figure 4:
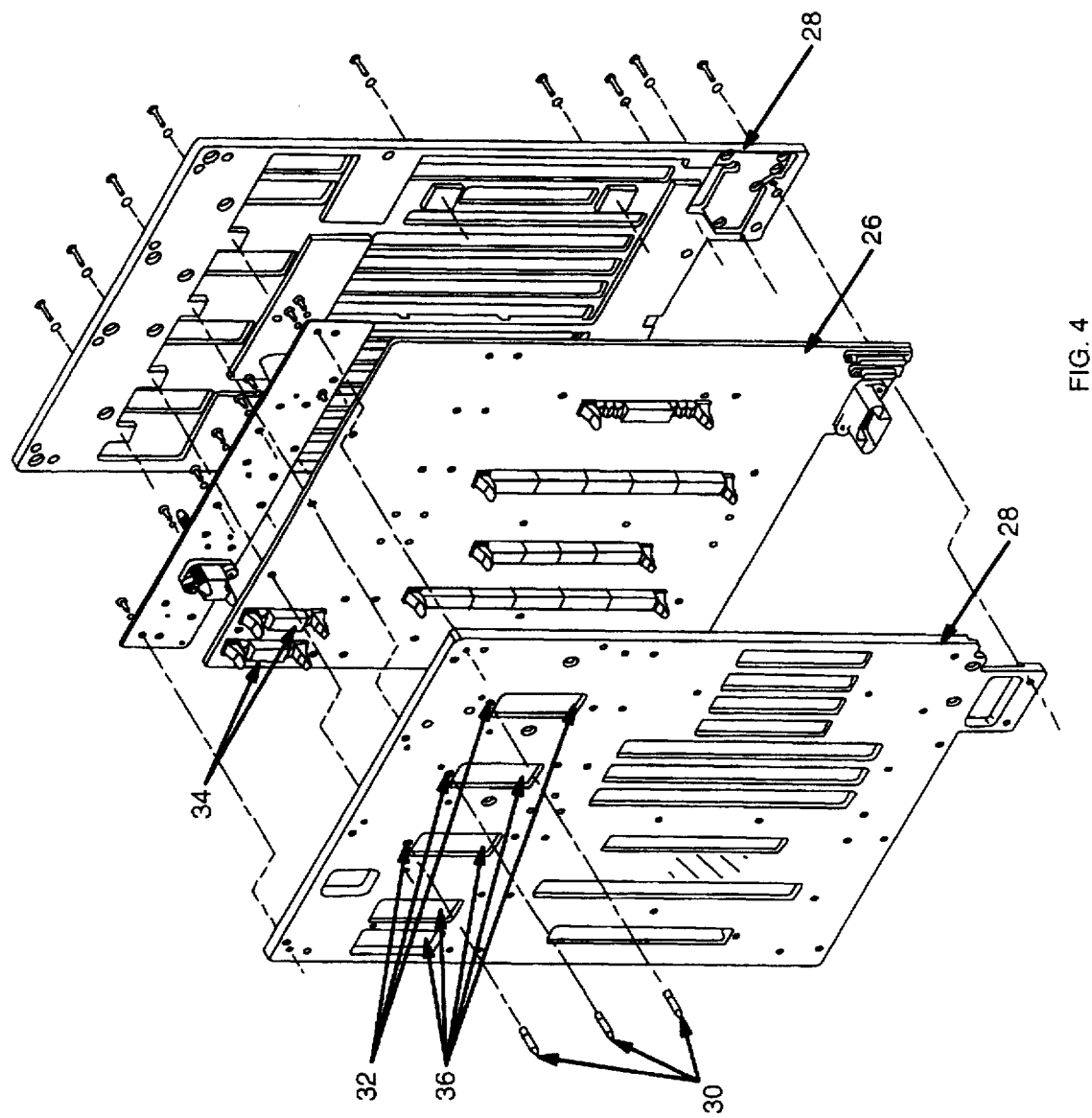

In the following, the invention will be explained in further details taking reference to a preferred embodiment thereof with the accompanying drawings, wherein FIG. 1 shows a casing of a data processing system in which the receiving device according to the invention is preferably used, FIG. 2 shows a component part in connection with the circuit board and the device according to the invention, FIG. 3 is an exploded view of a component part which is decoupled as to its weight from the circuit board due to the device in accordance with the invention;

FIG. 4 shows a circuit board as preferably used in the device according to the invention.

FIG. 1 shows the casing 2 of a data processing system in which the device according to the invention is preferably used. The casing 2 comprises components, the so-called power supply modules 4 consisting of an electronic board 12, in particular a logic board, and batteries. The power supply modules 4 are inserted into the upper part of the casing 2 by way of guide rails into the casing and are directly connected with the circuit board by means of a connector. As regards the heavy batteries contained in the power supply modules, there is a technical requirement of essentially relieving the sockets of the circuit board of the weight of said batteries. FIG. 2 shows the method of carrying out the said weight relief by means of the device in accordance with the invention.

FIG. 2 shows the receiving device in its operative interconnection with the power supply module 4 and the circuit board 26. The circuit board 26 is preferably installed between two reinforcing plates 28 in order to prevent a sagging of the circuit board 26 due to the heavy power supply modules 4. A holding pin 30 is placed on one of the reinforcing plates 28. The holding pin 30 is preferably placed on the reinforcing plate 28 so that the power supply module 4 engages automatically into the casing 14 of the power supply module 4 on contacting the circuit board 26, and carries the weight of the power supply module 4. If there are a plurality of power supply modules 4 one aside the other, each of the power supply modules 4 requires a separate holding pin 30 associated with it. The casing 14 of the power supply module 4 contains an opening in the form of a bore into which engages the holding pin 30. The plug 10 of the power supply module 4 is firmly located on the electronic board 12. The electronic board 12 is flexibly supported in the interior of casing 14 of the power supply module 4. The flexible support of the electronic board 12 within the casing 14 is obtained by supporting rotatably the electronic board 12 in the area of its center of gravity. This is preferably obtained by screwing the electronic board 12 in the area of its center of gravity to the side wall of the casing 14 by means of a screw 22.

The electronic board 12 is attached to the lateral wall of the casing 14 by means of the screws 22 and 24, so that the electronic board 12 is flexibly supported on the said screws in the direction of the longitudinal axis of the screws. Considering that the connector 10 is firmly attached to the electronic board 12, the flexibility of the electronic board 12 in this direction is required in order to facilitate an adjustment of the connector 10 in its horizontal direction with regard to the socket 34.

In this respect, the screw 22 serves as axis of rotation for the circuit board 12. Screws 24 and 22 are preferably collar screws designed so that the electronic board 12 has a clearance in the area of the screws 24, whereas the screw 22 serves as fixed fulcrum. Such flexibility of the electronic board 12 facilitates an adjustment of the connector 10 in its vertical and horizontal directions with regard to the socket 34 of the circuit board 26.

Thus the support of the electronic board 12 is so flexible that the connector 10 attached to the electronic board 12 can be adjusted without problem to the socket 34 of the circuit board both in vertical and in horizontal directions. Tolerance differences due to production may be adjusted by means of the flexible support of the electric board. The above described receiving device may be used in various technical systems, in particular in electronic equipment of any kind, as far as a direct connection of the various modules or components with the circuit board is desirable or required. The above described placement of the receiving device according to the invention is but one preferred implementation of this invention.

FIG. 3 is an exploded view on a power supply module 4, comprising the electronic board 12 with connector 10, batteries 18, casing section 14 and a casing lid 20. As will be seen in the exploded view, the electronic board 12 is secured to the internal wall of the casing section 14 by means of six screws 24. Screws 24 and bores within the electronic board 12 are selected in relative positions so that the screws 24 will have a certain clearance within the bores. The electronic board 12 is connected with the inner wall of the casing section 14 by means of a further screw 22. Screw 22 and the respective bore within the electronic board are selected in relative positions with respect to one another that the screw 22 is lodged within the bore, although rotatably but without clearance. Screw 22 is disposed preferably in the area of the center of gravity of the electronic board 12.

The complete attachment device of the electronic board 12 in the casing 14 of the power supply module is designed so that the said electronic board facilitates an adjustment to the position of the socket 34 the weight of the power supply module 4 being carried by the support device 30, in particular by a pin. Also other equivalent means such as screw, rivet etc. may be used. The batteries 18 are disposed in the casing lid 20. The casing 14 of the power supply module is provided with an opening for the connector 10.

FIG. 4 depicts a circuit board 26 with reinforcement plates 28 arranged on both sides. The holding pins 30 are placed on the reinforcement plate 28. In case that reinforcement plates 28 are not required, the holding pins 30 may be fastened directly to the circuit board 26. The reinforcement plate 28 is provided with openings 36 for accommodating the connector 10 of the power supply modules 4. The connectors 10 of the power supply modules are connected with the respective sockets 34 of the circuit board 26.

Summarizing, it may be said that the device according to the invention may be used for nearly all feasible technical connectors where in particular heavy assemblies are desired or required to be directly connected with a circuit board. This is true in particular for the devices of data processing but also of electrical engineering.

We claim:

1. A receiving device for an assembly including a casing having components therein; which assembly is directly connected to a first circuit board, said first circuit board and said assembly being connected by a connector connected to at least one of said components and a socket associated with said first circuit board, characterized in that;

said connector and said socket are disposed in a flexible manner with respect to one another and said at least one component is disposed in a flexible and rotatable manner within said casing in the area of said at least one said component's center of gravity; and that the dead weight of said assembly is carried by a supporting device independent from said connector.

2. The receiving device as claimed in claim 1, characterized in that;

said at least one component within said casing is a second circuit board, said second circuit board being disposed without clearance within said casing by means of a pin or a screw, and said second circuit board is connected to said casing on at least two locations, having a clearance so that said second circuit board having said connector connected thereto is movable in both vertical and horizontal directions with respect to said socket associated with said first circuit board.

3. The receiving device as claimed in claim 2, characterized in that said first circuit board includes at least one reinforcing plate associated therewith, and said support device comprises a pin which is disposed on said first circuit board directly or on said at least one reinforcing plate associated with said first circuit board, said pin engaging said casing.

4. The receiving device as claimed in claim 1 wherein said assembly, said first circuit board, said connector and said socket comprise a data processing system.

5. An electronic apparatus comprising at least one assembly and at least one first circuit board, said assembly and said first circuit board being connected by means of a connector and a socket associated with said at least one first circuit board, characterized in that;

a supporting device is disposed within said electronic apparatus for receiving said assembly, said connector and said socket being disposed flexibly with respect to one another so that a connection between said connector and said socket can be established, said electronic apparatus further including a second circuit board having said connector connected thereto and movable in a rotatable manner with respect to said socket.

* * * * *